United States Patent
Haight et al.

(10) Patent No.: US 7,915,146 B2
(45) Date of Patent: Mar. 29, 2011

(54) CONTROLLED DOPING OF SEMICONDUCTOR NANOWIRES

(75) Inventors: Richard A. Haight, Mahopac, NY (US); Mark C. Reuter, Montrose, NY (US)

(73) Assignee: International Business Machines Corporation, Armonk, NY (US)

( * ) Notice: Subject to any disclaimer, the term of this patent is extended or adjusted under 35 U.S.C. 154(b) by 579 days.

(21) Appl. No.: 11/877,016

(22) Filed: Oct. 23, 2007

(65) Prior Publication Data
US 2009/0102019 A1  Apr. 23, 2009

(51) Int. Cl.
*H01L 21/20* (2006.01)
(52) U.S. Cl. ...... 438/478; 438/510; 438/542; 438/558; 977/749; 977/762
(58) Field of Classification Search .......... 438/478, 438/510, 542, 558; 977/749, 762, 813–815
See application file for complete search history.

(56) References Cited

U.S. PATENT DOCUMENTS

| | | |
|---|---|---|
| 6,962,823 B2 | 11/2005 | Empedocles et al. |
| 7,087,920 B1 | 8/2006 | Kamins |
| 7,105,428 B2 | 9/2006 | Pan et al. |
| 7,211,464 B2 | 5/2007 | Lieber et |
| 2007/0215859 A1 | 9/2007 | Clifton |

FOREIGN PATENT DOCUMENTS
WO  WO 03/005450 A2  1/2003

OTHER PUBLICATIONS

Lauhon et al, "Expitaxial core-shell and core-multishell nanowire heterostructures", Nov. 2002, Nature, vol. 420, pp. 57-61.*
Li et al, "Remote p-doping of InAs Nanowires", Apr. 2007, NanoLetters, vol. 7, pp. 1144-1148.*

(Continued)

*Primary Examiner* — David Vu
*Assistant Examiner* — Suberr Chi
(74) *Attorney, Agent, or Firm* — Scully, Scott, Murphy & Presser, P.C.; Vazken Alexanian (57) ABSTRACT

A catalyst particle on a substrate is exposed to reactants containing a semiconductor material in a reactor. An intrinsic semiconductor nanowire having constant lateral dimensions is grown at a low enough temperature so that pyrolysis of the reactant is suppressed on the sidewalls of the intrinsic semiconductor nanowire. Once the intrinsic semiconductor nanowire grows to a desired length, the temperature of the reactor is raised to enable pyrolysis on the sidewalls of the semiconductor nanowire, and thereafter dopants are supplied into the reactor with the reactant. A composite semiconductor nanowire having an intrinsic inner semiconductor nanowire and a doped semiconductor shell is formed. The catalyst particle is removed, followed by an anneal that distributes the dopants uniformly within the volume of the composite semiconductor nanowire, forming a semiconductor nanowire having constant lateral dimensions and a substantially uniform doping.

20 Claims, 12 Drawing Sheets

OTHER PUBLICATIONS

Wagner, "Vapor liquid solid mechanism of single crystal growth", Mar. 1964, Applied Physics Letters, vol. 4, pp. 89-90.*

M. Verheijen et al, "Growth Kinetics of Heterostructured GaP-GaAs Nanowires", J. of the American Chemical Society, vol. 128, pp. 1353-1359.*

Yang, Chen et al, "Encoding Electronic Properties by Synthesis of Axial Modulation-Doped Silicon Nanowires", Science, Nov. 25, 2005, pp. 1304-1307, vol. 310. Byon, K. at al., "Synthesis and postgrowth doping of silicon nanowires", Applied Physics Letters, Nov. 1, 2005, pp. 193104/1-3, vol. 87, American Institute of Physics.

Tutuc, E. at al., "Morphology of germanium nanowires grown in presence of B2H6", Applied Physics Letters, Jan. 26, 2006, pp. 043113/1-3, vol. 88, American Institute of Physics.

Tutuc, Emanuel et al., "Realization of a Linear Germanium Nanowire p-n Junction", Nano Letters, Aug. 4, 2006, pp. A-E, vol. 0, American Chemical Society.

Ross, F.M. et al., "Sawtooth Faceting in Silicon Nanowires", Physical Review Letters, Sep. 30, 2005, pp. 146104/1-4, vol. 95, American Physical Society.

Hsu, Hsu-Cheng et al., "Band Gap Engineering and Stimulated Emission of ZnMgO Nanowires", Applied Physics Letters, Jul. 3, 2006, pp. 013101/1.3, vol. 89, Issue 1, American Institute of Physics.

Zhou, Chongwu et al., "Modulated Chemical Doping of Individual Carbon Nanotubes", Science, Nov. 24, 2004, pp. 1552-1555, vol. 290, No. 5496.

* cited by examiner

FIG. 8C

CONTROLLED DOPING OF SEMICONDUCTOR NANOWIRES

FIELD OF THE INVENTION

The present invention relates to semiconductor structures, and particularly to doped semiconductor nanowires and methods of manufacturing the same.

BACKGROUND OF THE INVENTION

A nanowire refers to a wire having a diameter from about 1 nm to about 1,000 nm. Implied in the use of the term "nanowire" is the assumption that the length of the nanowire is substantially greater than the diameter of the nanowire. Nanowires having a diameter at a low end of the range, i.e., a diameter from about 1 nm to about 100 nm, exhibit quantum mechanical properties, and are also called "quantum wires." A nanowire may comprise a metallic material, a semiconductor material, or an insulator material. Both organic nanowires, e.g., deoxyribonucleic acid (DNA), and inorganic nanowires are known in the art.

The ratio of the length of a nanowire to the diameter of the nanowire is referred to as an aspect ratio. Typical aspect ratios for nanowires range from about 10 to about 1,000,000. As such, one dimension, i.e., the length, of a nanowire may be considered to be virtually infinite for practical purposes, while the diameter of the nanowire determines predominant physical and chemical characteristics of the nanowire. Quantum mechanical properties of nanowires due to the limited dimension of the nanowire in the plane perpendicular to the length of the nanowire have been observed in many types of nanowires.

Devices employing semiconductor nanowires have been proposed in the art. One of the challenges in the manufacture of the semiconductor devices employing semiconductor nanowires has been the difficulty in forming doped semiconductor nanowires. Particularly, controlled doping of semiconductor nanowires comprising silicon or germanium presents a significant challenge.

Prior art publications propose doping of semiconductor nanowires by a dopant gas such as phosphene, diborane, etc. with a reactant gas such as silane or germane during the growth of the nanowire. One such example is U.S. Pat. No. 6,962,823 to Empedocles et al., which describes in-situ doping of isolated bands in a semiconductor nanowire by changing of dopant level during growth of the semiconductor nanowire. Application of this approach to form a silicon nanowire or a geranium nanowire faces severe problems that hamper its usefulness. In particular, a relatively low temperature range from about 350° C. to about 450° C. is required to grow certain types of semiconductor nanowires, such as silicon nanowires and germanium nanowires, with diameters less than 30 nm. At an elevated temperature above 500° C., such semiconductor nanowires grow laterally.

Unfortunately, a relatively high temperature above 500° C. is required to successfully incorporate dopant atoms at a significant level, i.e., at a concentration of about $1.0 \times 10^{17}/cm^3$ or above, into the semiconductor nanowire during growth. However, at such a temperature, the semiconductor nanowire also grows laterally since the elevated temperature enables pyrolysis of reactants on the exposed surfaces of the semiconductor nanowire. Suppression of pyrolysis of reactants on sidewall surfaces of semiconductor nanowires and doping of the sidewall surfaces of the semiconductor wires are mutually incompatible in many semiconductor nanowires. In other words, doping of the sidewall surfaces of the semiconductor wires necessarily causes pyrolysis of reactants on the sidewall surfaces the semiconductor nanowires.

Figure 1:
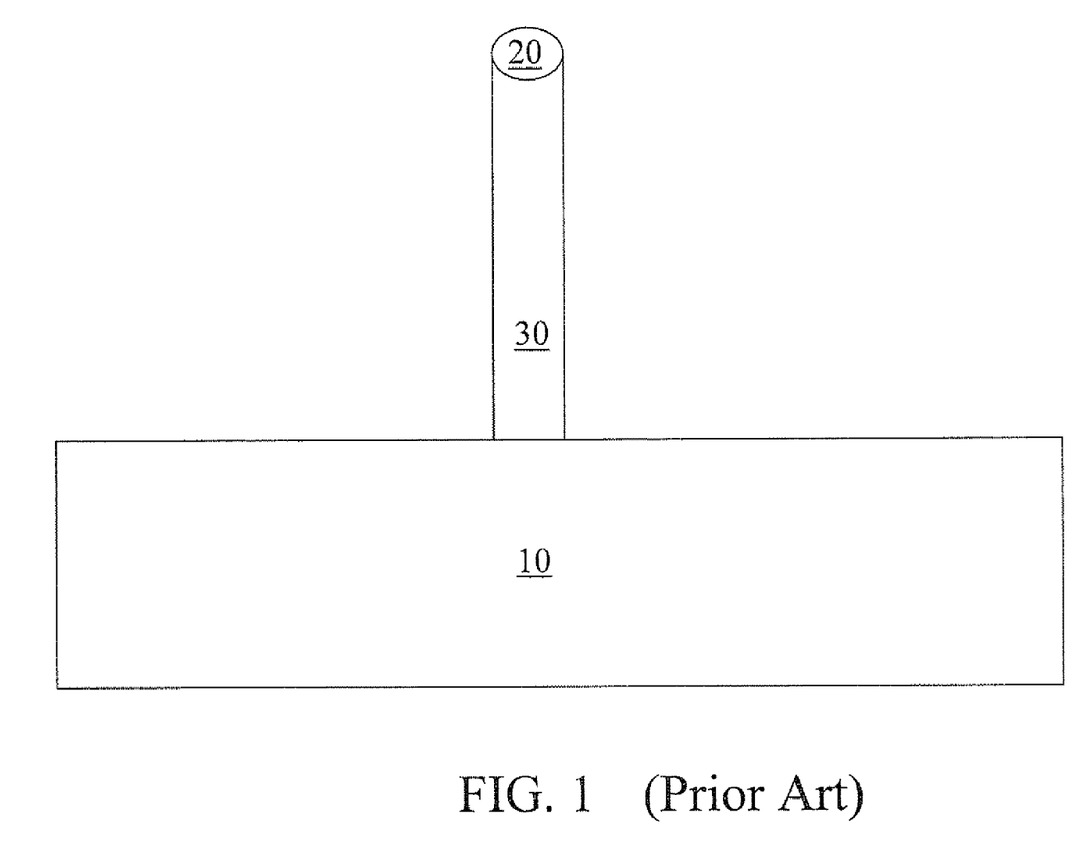
FIG. 1 is a vertical cross-sectional view of an exemplary prior art undoped semiconductor nanowire.
Figure 2:
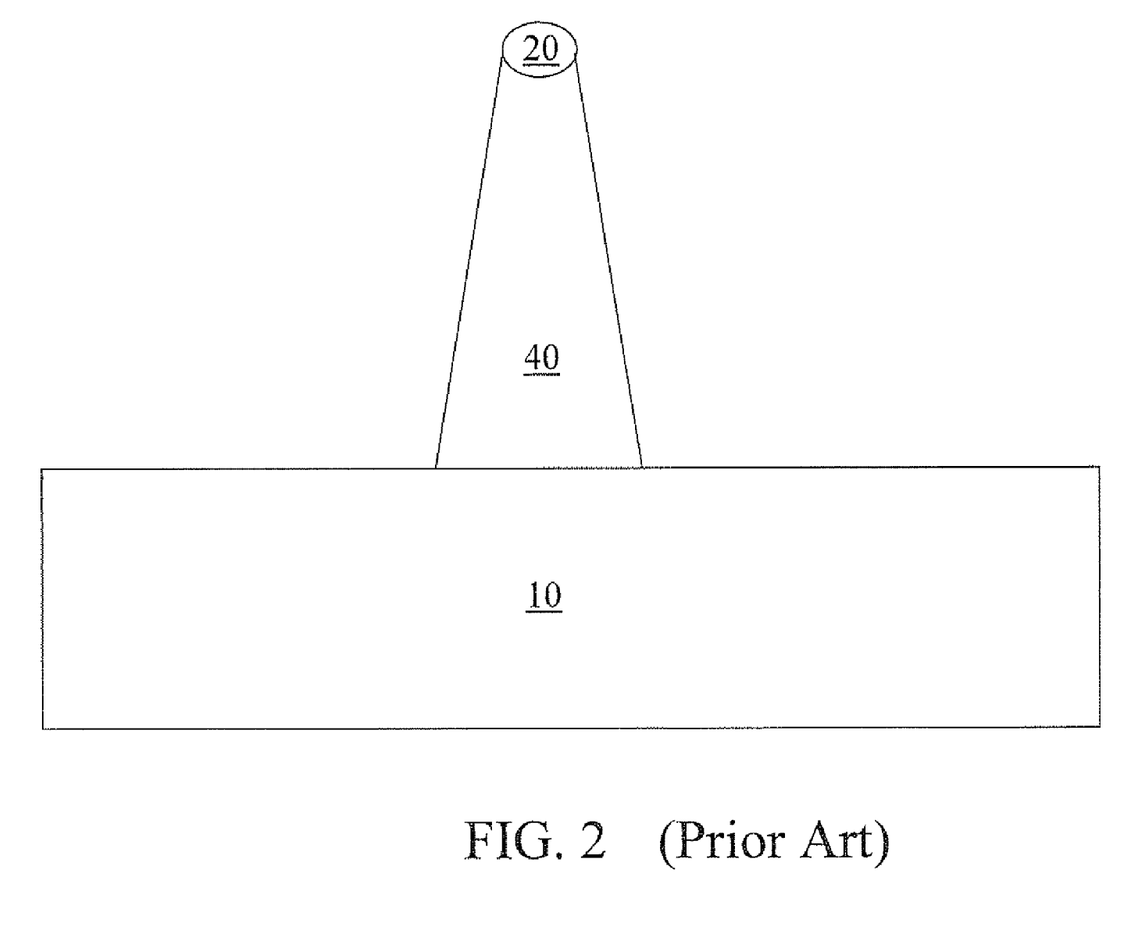
FIG. 2 is a vertical cross-sectional view of an exemplary prior art in-situ doped semiconductor nanowire.

This situation is illustrated in FIGS. 1 and 2. In FIG. 1, a catalyst particle 20, such as a gold particle, is placed on a substrate 10, which may comprise an insulator material or a semiconductor material. In a temperature range from about 350° C. to about 450° C., a semiconductor nanowire 30 is grown as reactants containing a semiconductor material, e.g., $SiH_4$, $Si_2H_6$, $GeH_4$, etc., are supplied into a reactor, such as a low pressure chemical vapor deposition (LPCVD) chamber or an ultra-high vacuum chemical vapor deposition (UH-VCVD) chamber. The catalyst particle 20 forms a thin moving eutectic region (not shown) at the interface between the catalyst particle 20 and the top region of the semiconductor nanowire 30, and travels at the top of the semiconductor nanowire throughout the growth process. The diameter, or the lateral dimensions, of the semiconductor nanowire 30 is substantially the same as the lateral dimensions of the catalyst particle 20. At this temperature range, dopant incorporation into the semiconductor nanowire 30 is negligible. Thus, even if a high partial pressure is maintained for dopant gases in a reactor, dopant incorporation into the semiconductor nanowire 30 is insignificant, and the semiconductor nanowire 30 remains essentially undoped.

Referring to FIG. 2, to force incorporation of dopants, the temperature of the reactor must be increased above 500° C. in the case of some semiconductor wires such as a silicon nanowire and a germanium wire. In this case, however, pyrolysis occurs on the sidewalls of a doped semiconductor nanowire 40. While dopants are incorporated into the doped semiconductor nanowire 40 during the growth, lateral growth of the doped semiconductor wire 40 is unavoidable. Further, a bottom portion of the doped semiconductor wire 40, being exposed to the reactants for a longer time, has a larger diameter than a top portion of the doped semiconductor wire 40, which is exposed to the reactants for a shorted period of time, and has lateral dimensions close to lateral dimensions of the catalyst particle 20. Thus, the doped semiconductor wire 40 has a taper in the diameter, i.e., a constant diameter for the doped semiconductor wire 40 cannot be achieved.

An alternate approach to forming doped semiconductor wires is to implant dopants into nanowires. However, ion implantation tends to be an inherently violent process due to the high energy of the implanted ions, and causes amorphization of the nanowire crystalline structure and sputtering of the nanowire itself. Thus, the ion implantation tends to cause wire deformation and/or wire breakage during the ion implantation process. Subsequent anneals are required to recrystallize the nanowire, which may not be wholly effective if the structural damage is extensive.

While prior art publications, such as U.S. Pat. No. 7,105,428 to Pan et al., and U.S. Pat. No. 7,211,464 to Lieber et al., disclose useful applications of doped semiconductor nanowires, methods of forming such useful structures still need to be provided to enable such structures.

Thus, there exists a need for methods of forming a semiconductor wire having constant lateral dimensions and a significant level of doping, i.e., at a concentration of about $1.0 \times 10^{17}/cm^3$ or above.

Further, there exists a need for methods of forming a doped semiconductor wire having constant lateral dimensions, such as a diameter, of less than 30 nm.

In this disclosure we describe a simple method for controllably incorporating dopant atoms into semiconductor nanowires. This process separates the initial growth of the nanowire from the doping process, thereby allowing the growth of the nanowire to be decoupled from dopant incorporation into the nanowire crystalline structure.

SUMMARY OF THE INVENTION

The present invention addresses the needs described above by providing a method for controllably incorporating dopant atoms into a semiconductor nanowire of constant lateral dimensions. This method separates the initial growth of the semiconductor nanowire from a subsequent doping process, thereby allowing the growth of the semiconductor nanowire to be decoupled from dopant incorporation into the semiconductor nanowire.

In the present invention, a catalyst particle is formed on a substrate, which is exposed to reactants containing a semiconductor material in a reactor. An intrinsic semiconductor nanowire having constant lateral dimensions is grown as the catalyst particle moves on top of the intrinsic semiconductor nanowire. The intrinsic semiconductor nanowire is grown at a low enough temperature so that pyrolysis of the reactant is suppressed on the sidewalls of the intrinsic semiconductor nanowire. Once the intrinsic semiconductor nanowire grows to a desired length, the temperature of the reactor is raised to enable pyrolysis on the sidewalls of the semiconductor nanowire, and thereafter dopants are supplied into the reactor with the reactant. A composite semiconductor nanowire having an intrinsic inner semiconductor nanowire and a doped semiconductor shell is formed. The catalyst particle is removed, followed by an anneal that distributes the dopants uniformly within the volume of the composite semiconductor nanowire, forming a semiconductor nanowire having constant lateral dimensions and a substantially uniform doping.

According to an aspect of the present invention, a method of forming a semiconductor nanowire is provided, which comprises:

forming a catalyst particle on a substrate;

growing an undoped semiconductor nanowire between the catalyst particle and the substrate by subjecting the catalyst particle to a first reactant gas at a first temperature, wherein pyrolysis of the first reactant gas on sidewalls of the semiconductor nanowire is suppressed at the first temperature; and growing a shell of a doped semiconductor material around sidewalls of the undoped semiconductor nanowire by subjecting the undoped semiconductor nanowire to a second reactant and a dopant at a second temperature, wherein the second reactant and the dopant is incorporated into the shell by pyrolysis.

In one embodiment, the undoped semiconductor nanowire comprises a group IV semiconductor material, a III-V compound semiconductor material, a II-VI compound semiconductor material, and an alloy thereof.

In another embodiment, the doped semiconductor material comprises a group IV semiconductor material, a III-V compound semiconductor material, a II-VI compound semiconductor material, and an alloy thereof.

In even another embodiment, the doped semiconductor material further comprises at least one of B, Ga, In, P, As, and Sb.

In yet another embodiment, the undoped semiconductor nanowire has a substantially constant cross-sectional area across an entire length of the undoped semiconductor nanowire. Lateral dimensions of the undoped semiconductor nanowire may be from about 1 nm to about 1,000 nm, and further; may be less than 30 nm.

In still another embodiment, the shell has a substantially constant cross-sectional area across an entire length of the shell. The shell may have a thickness from about 0.3 nm to about 10 nm.

In a further embodiment, the shell has a doping concentration from about $1.0\times10^{18}/cm^3$ to about $5.0\times10^{21}/cm^3$.

In an even further embodiment, the catalyst particle has a lateral dimension from about 1 nm to about 1,000 nm. Further, the lateral dimension of the catalyst particle may be less than 30 nm.

In a yet further embodiment, the catalyst particle comprises one of Au, Ag, Cu, Pt, Fe, Co, Ni, In, Ta, Ti, Zn, Cd, and Sn.

In a still further embodiment, the first reactant comprises at least one of $SiH_4$, $Si_2H_6$, $SiH_2Cl_2$, $SiHCl_3$, $SiCl_4$, $GeH_4$, $Ge_2H_6$, $GeH_3Cl$, $GeH_2Cl_2$, $GeHCl_3$, and $GeCl_4$.

In a still yet further embodiment, the first temperature is from about 350° C. to about 450° C.

In further another embodiment, the second reactant comprises at least one of $SiH_4$, $Si_2H_6$, $SiH_2Cl_2$, $SiHCl_3$, $SiCl_4$, $GeH_4$, $Ge_2H_6$, $GeH_3Cl$, $GeH_2Cl_2$, $GeHCl_3$, and $GeCl_4$.

In even further another embodiment, the dopant comprises one of $B_2H_6$, $GaH_3$, $GaCl_3$, $Ga_2Cl_6$, $PH_3$, $POCl_3$, $AsH_3$, $SbH_3$, and $SbF_3$.

In yet further another embodiment, the second temperature is from about 500° C. to about 1,100° C.

In still further another embodiment, the method further comprises annealing the undoped semiconductor nanowire and the shell at an elevated temperature from about 600° C. to about 1,200° C., wherein the undoped semiconductor nanowire and the shell have a substantially uniform doping concentration after the anneal.

In still yet further another embodiment, the substantially uniform doping concentration is from about $1.0\times10^{17}/cm^3$ to about $5.0\times10^{20}/cm^3$.

In a further embodiment, the substantially uniform doping concentration is the product of a doping concentration of said shell and a ratio of a volume of said shell to a sum of volumes of said shell and said undoped semiconductor nanowire.

In still further embodiment, a doping concentration of said shell is set by a partial pressure of a dopant gas in a process chamber or a ratio between a partial pressure of said dopant gas to a partial pressure of a reactant.

The substantially uniform doping concentration may be changed either by adjusting a doping concentration of the shell, adjusting of thickness of the shell, or a combination of both.

According to another aspect of the present invention, a semiconductor nanowire formed by the methods described above is provided.

A semiconductor nanowire structure according to the present invention comprises:

an undoped semiconductor nanowire formed by subjecting the catalyst particle to a first reactant gas at a first temperature, wherein pyrolysis of the first reactant gas on sidewalls of the semiconductor nanowire is suppressed at the first temperature; and a shell of a doped semiconductor material abutting and surrounding sidewalls of the undoped semiconductor nanowire and formed by subjecting the undoped semiconductor nanowire to a second reactant and a dopant at a second temperature, wherein the second reactant and the dopant is incorporated into the shell by pyrolysis.

DETAILED DESCRIPTION OF THE INVENTION

As stated above, the present invention relates to doped semiconductor wires having constant lateral dimensions and methods of manufacturing the same, which are now described in detail with accompanying figures. It is noted that like and corresponding elements are referred to by like reference numerals, and that the figures are not drawn to scale.

Figure 3A:
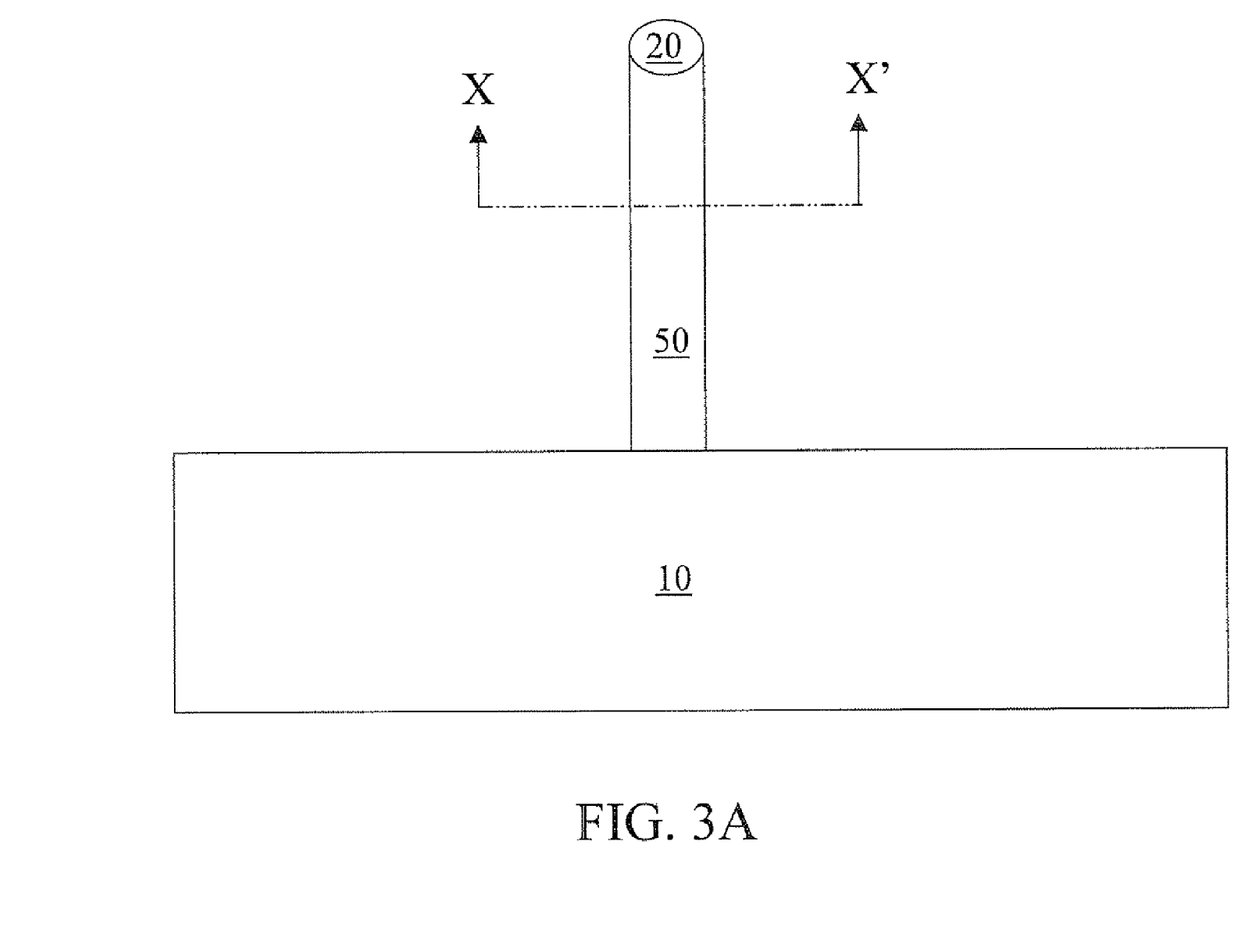
FIG. 3A is a vertical cross-sectional view of an exemplary semiconductor nanowire according to the present invention after formation of an undoped semiconductor nanowire.
Figure 3B:
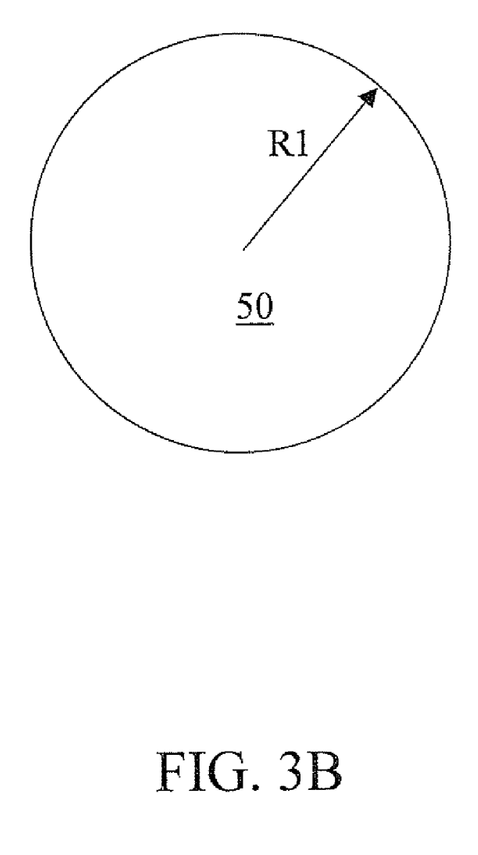
FIG. 3B is a horizontal cross-sectional view of the exemplary semiconductor nanowire in FIG. 3A along the plane X-X'.

Referring to FIGS. 3A and 3B, an exemplary semiconductor nanowire structure according to the present invention is shown, which comprises a substrate 10, an undoped semiconductor nanowire 50, and a catalyst particle 20. The exemplary semiconductor nanowire is provided by first growing an undoped semiconductor nanowire 50 on the substrate 10 by catalytic growth induced by the catalyst particle 20.

The substrate 10 may comprise a semiconductor material, or an insulator material. Semiconductor materials that may be employed in the substrate 10 include group IV semiconductor materials, III-V compound semiconductor materials, II-VI compound semiconductor materials, and alloys thereof. The insulator materials that may be employed in the substrate include dielectric oxides and dielectric nitrides. Exemplary dielectric oxides include silicon oxide and dielectric metal oxides including high dielectric constant dielectric material having a dielectric constant greater than 4.0 such as $HfO_2$, $ZrO_2$, $La_2O_3$, $Al_2O_3$, $TiO_2$, $SrTiO_3$, $LaAlO_3$, and $Y_2O_3$. Exemplary dielectric nitrides include silicon nitride and ceramic nitrides such as aluminum nitride, strontium nitride, boron nitride, and beryllium nitride. The substrate 10 may be single crystalline, polycrystalline, or amorphous.

The catalyst particle 20 comprises a material that induces catalytic growth of a semiconductor nanowire in a suitable environment. Exemplary materials for the catalyst particle 20 include, but are not limited to, Au, Ag, Cu, Pt, Fe, Co, Ni, In, Ta, Ti, Zn, Cd, and Sn. The catalyst particle 20 has lateral dimensions from about 1 nm to about 1,000 nm, and preferably from about 1 nm to about 30 nm. The catalyst particle 20 may, or may not have a radial symmetry, i.e., horizontal cross-sectional areas may, or may not be, a circle. The catalyst particle 20 may be a sphere, an ellipsoid, a cylinder, a cone, a regular polyhedron, an irregular polyhedron, or a combination thereof. The lateral dimensions of the catalyst particle 20 refer to characteristic dimensions of the catalyst particle 20 if such a characteristic dimension exists. For example, in case a horizontal cross-sectional area is a circle or an ellipse, the characteristic dimension may be a diameter, a major axis, and/or a minor axis. In case the catalyst particle 20 does not have a regular shaped cross-sectional area, the lateral dimensions refer to the maximum of lateral extent of a cross-sectional area. If multiple cross-sectional areas provide different lateral extents, the cross-sectional area that provides the maximum lateral extent is employed to characterize the lateral dimensions of the catalyst particle 20.

Once the catalyst particle 20 is placed on the substrate 10, the catalyst particle 20 and the substrate 10 are subjected to a condition conducive to the growth of the undoped semiconductor nanowire 50 in a process chamber, which may be a low pressure chemical vapor deposition (LPCVD) chamber or an ultra-high vacuum chemical vapor deposition (UHVCVD) chamber. The undoped semiconductor nanowire 50 is grown by catalytic growth of a semiconductor material, which is known in the art and described, for example, in U.S. Pat. Nos. 7,105,428; 7,211,464; and 6,962,823 supra. Specifically, the catalytic growth of the undoped semiconductor wire 50 is effected by supplying a reactant containing a semiconductor material to be incorporated into the undoped semiconductor wire 50 at an elevated temperature, which is herein referred to as a first temperature.

The semiconductor material of the undoped semiconductor nanowire 50 may be a group IV semiconductor material such as silicon and germanium. In case the semiconductor material comprises silicon, the reactant may be $SiH_4$, $Si_2H_6$, $SiH_2Cl_2$, $SiHCl_3$, $SiCl_4$, $GeH_4$, or a combination thereof. In case the semiconductor material comprises germanium, the reactant may be one of $GeH_4$, $GeH_4$, $Ge_2H_6$, $GeH_3Cl$, $GeH_2Cl_2$, $GeHCl_3$, and $GeCl_4$. Alternately, the semiconductor material of the undoped semiconductor nanowire 50 may be a III-V compound semiconductor material, or a II-VI compound semiconductor material. In this case, the reactant comprises a mixture of precursors that provide the semiconductor material to the undoped semiconductor nanowire upon reaction with the catalyst particle 20. The semiconductor material of the undoped semiconductor nanowire 50 may be a mixture of any semiconductor material, in which case the reactant is a combination of the various gases and/or precursors described above.

The first temperature, which is the temperature employed for growth of the undoped semiconductor nanowire 50, is selected to avoid lateral growth of the semiconductor material on sidewalls of the undoped semiconductor nanowire. Pyrolysis of the reactant in the absence of the catalyst particle 20 is effected at a higher temperature than catalytic pyrolysis effected on the surface of the catalyst particle 20. In other words, one of the functions of the catalyst particle 20 is to enable catalytic pyrolysis of the reactant at a temperature at which normal pyrolysis of the reactant would not occur without the catalyst particle 20. The first temperature is selected so that catalytic pyrolysis of the reactant occurs directly beneath the catalyst particle 20, while pyrolysis of the reactant does not occur on normal surfaces including sidewalls of the undoped semiconductor nanowire 50. In case the undoped semiconductor nanowire 50 comprises silicon or germanium, the first temperature may be from about 350° C. to about 500° C., and preferably from about 350° C. to about 450° C., and most preferably from about 350° C. to about 400° C. Typically, the undoped semiconductor nanowire 50 is entirely single crystalline since the catalytic growth induces epitaxial alignment of the semiconductor atoms during the growth.

The lateral dimensions of the undoped semiconductor nanowire 50 may be substantially the same as the lateral dimensions of the catalyst particle 20. Lack of pyrolysis on sidewalls of the undoped semiconductor nanowire 50 preserves the lateral dimensions of portions of the undoped semiconductor nanowire even after the catalyst particle 20 moves away from the portion as the growth of the undoped semiconductor nanowire 50 continues. Thus, the undoped semiconductor nanowire 50 has a constant cross-sectional area independent of the location within the undoped semiconductor nanowire 50. The cross-sectional area of the undoped semiconductor nanowire 50 may be circular, elliptical, polygonal, or may be a composite shape of a curved portion and a polygonal portion. In case the cross-sectional area of the undoped semiconductor nanowire 50 is a circle, the radius R1 of the circle may be from about 0.5 nm to about 500 nm with a corresponding radius from about 1 nm to about 1,000 nm, and preferably from about 0.5 nm to about 15 nm with a corresponding radius from about 1 nm to about 30 nm.

The undoped semiconductor nanowire 50 is substantially undoped, i.e., any dopant, if present, is at a trace level or at a level that does not increase conductivity of the undoped semiconductor nanowire to any significant level. Dopants herein refer to electrical dopants that confer p-type doping or n-type doping on a semiconductor material as well known in the art. P-type dopants include B, Ga, and In. N-type dopants include P, As, and Sb. Typically, a doping concentration of less than $1.0\times10^{17}/cm^3$ is insufficient to induce any significant increase in the conductivity of a semiconductor material. Preferably, no dopant is supplied into the process chamber during the growth of the undoped semiconductor nanowire 50, and any dopant in the undoped semiconductor nanowire 50 is at a trace level.

It is to be noted that even if dopant gases are provided within the process chamber during the growth of the undoped semiconductor nanowire 50 at the first temperature, the first temperature is insufficient to effect any significant level of dopant incorporation of the dopant gases into the undoped semiconductor nanowire. This is because the catalytic growth selectively incorporates the semiconductor material at the expense of dopant atoms that may be provided from the dopant gases. Thus, even if any dopant gas is supplied into the gas stream along with the reactant, the doping concentration of the undoped semiconductor nanowire 50 is much less than $1.0\times10^{17}/cm^3$, thus rendering the undoped semiconductor nanowire 50 "undoped," i.e., having a doping at a level that renders the properties of the undoped semiconductor nanowire 50 essentially the same as the corresponding properties of a semiconductor nanowire with no doping.

Figure 4A:
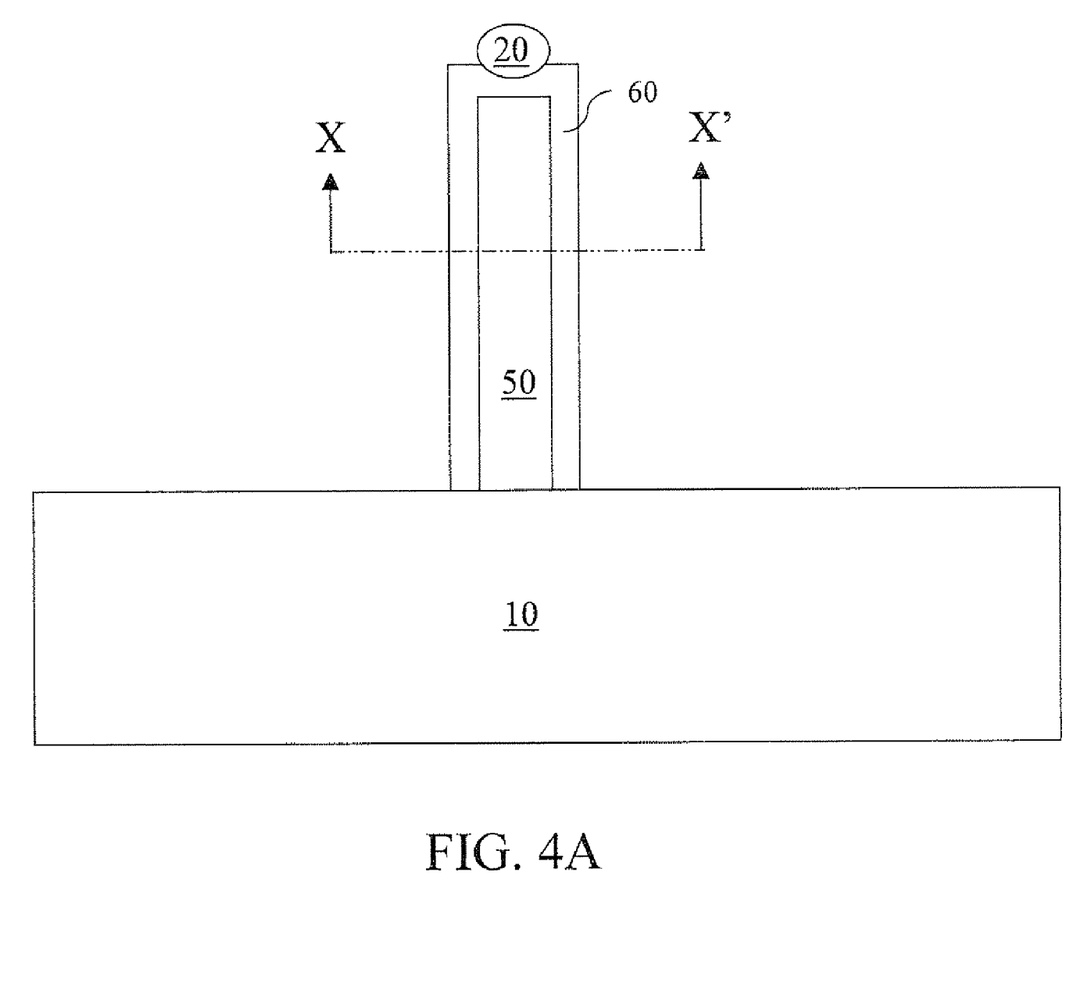
FIG. 4A is a vertical cross-sectional view of an exemplary semiconductor nanowire according to the present invention after formation of a doped shell.
Figure 4B:
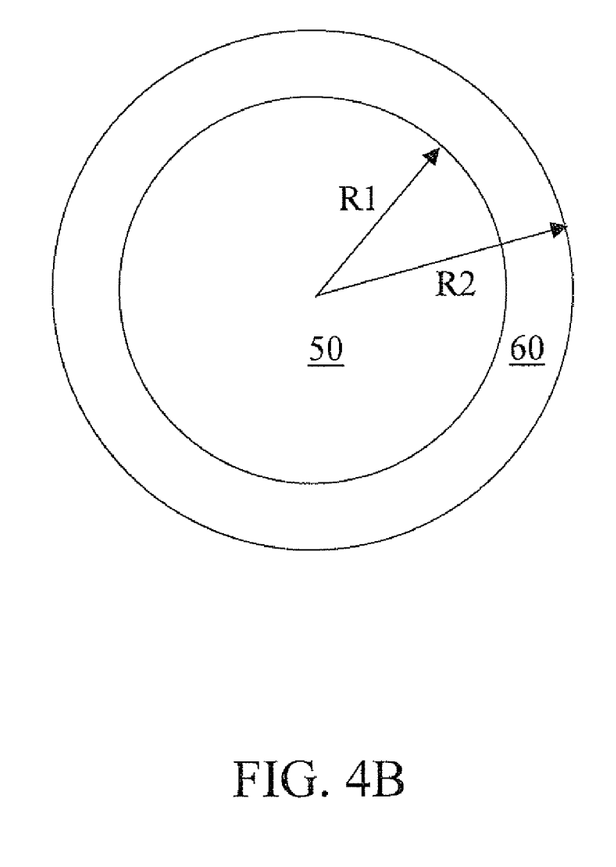
FIG. 4B is a horizontal cross-sectional view of the exemplary semiconductor nanowire in FIG. 4A along the plane X-X'.

Referring to FIGS. 4A and 4B, a shell 60 of a doped semiconductor material is grown directly on and around the sidewall of the undoped semiconductor nanowire 50 by exposing the undoped semiconductor nanowire 50 to a mixture of a reactant and a dopant gas at another elevated temperature, which is herein referred to as a second temperature. This processing step may employ the same process chamber as, or a different process chamber from, the process chamber employed for the growth of the undoped semiconductor nanowire 50. Use of the same process chamber provides the advantage of preventing exposure of the surfaces of the undoped semiconductor wire 50 to an ambient gas outside the process chamber.

The doped semiconductor material may comprise the same semiconductor material as, or a different semiconductor material from, the undoped semiconductor nanowire 50. In general, any of the semiconductor material that may be employed for the undoped semiconductor nanowire 50 as listed above may be employed for the doped semiconductor material for the shell 60. The reactant for the growth of the shell 60 is selected based on the material of the shell, and may be the same as the reactants listed above, i.e., $SiH_4$, $Si_2H_6$, $SiH_2Cl_2$, $SiHCl_3$, $SiCl_4$, $GeH_4$, $GeH_4$, $Ge_2H_6$, $GeH_3Cl$, $GeH_2Cl_2$, $GeHCl_3$, $GeCl_4$, and other precursors for compound semiconductors.

The dopant gas comprises a gas phase compound of a dopant atom. Exemplary dopant gases include, but are not limited to, $B_2H_6$, $GaH_3$, $GaCl_3$, $Ga_2Cl_6$, $PH_3$, $POCl_3$, $AsH_3$, $SbH_3$, and $SbF_3$. The dopant gas may be supplied concurrently and continuously with the reactant into the process chamber so that the composition of the shell 60 is uniform, or alternately, may be supplied intermittently into the process chamber so that the shell 60 has a layered structure with modulations in the dopant concentration within the shell 60. Dopant concentration in the shell 60 may be controlled by adjusting the partial pressure of the dopant gas and/or the ratio of the partial pressure of the dopant gas to the partial pressure of the reactant.

The shell 60 grows on sidewalls of the undoped semiconductor wire 50 and at the top of the undoped semiconductor wire 50. The catalyst particle 20 may be separated from the undoped semiconductor nanowire 50 by the growth of the shell 60. Due to the in-situ doping of the shell, i.e., the incorporation of dopants into the shell 60 during the growth, the shell 60 comprises both a semiconductor material and a dopant. Preferably, the doping concentration of the shell is from about $1.0\times10^{18}/cm^3$ to about $5.0\times10^{21}/cm^3$, more preferably, from about $5.0\times10^{19}/cm^3$ to about $5.0\times10^{21}/cm^3$ to effect a high doping concentration level in the undoped semiconductor wire 50 after an anneal to be subsequently performed.

The growth of the shell 60 is not catalytic, i.e., the presence of the catalyst particle 20 is not necessary for precipitating the growth of the shell, although the catalyst particle 20 may enhance deposition rate of the shell 60 over the undoped semiconductor nanowire 50. To insure that growth of the shell 60 occurs on the sidewalls of the undoped semiconductor nanowire 50, the second temperature, i.e., the temperature of the growth of the shell 60, is set at a sufficiently high temperature at which pyrolysis of the reactant proceeds even without the catalyst particle 20. In the case the shell 60 comprises silicon or germanium, the second temperature may be from about 500° C. to about 1,100° C., and preferably from about 500° C. to about 700° C. The shell is typically single crystalline as the doped semiconductor material of the shell 60 is grown in epitaxial registry with the underlying undoped semiconductor nanowire 50.

The cross-sectional area of the shell 60 is independent of the location along the shell 60. Since the shell 60 laterally encloses the undoped semiconductor nanowire 50, the inner surface of the shell 60 conforms to the outer surface of the undoped semiconductor nanowire 50. The cross-sectional area of the shell 60 may be annular, or may comprise an expanded shape of the cross-sectional area of the undoped semiconductor nanowire 50 from which the shape of the cross-sectional area of the undoped semiconductor nanowire is subtracted. The thickness of the shell 60 may be from about 0.5 nm to about 100 nm, and typically from about 1 nm to about 10 n. The thickness of the shell 60 may be from about 5% to about 100% of the lateral dimensions of the undoped semiconductor nanowire 50, and preferably from about 20% to about 50% of the lateral dimensions of the undoped semiconductor nanowire 50, although lesser and greater percentages are explicitly contemplated herein also. In case the cross-sectional area of the undoped semiconductor nanowire 50 is a circle, the cross-sectional area of the shell is an annulus or a ring having an inner radius and an outer radius R2. The inner radius is the same as the radius R1 of the circle of the cross-sectional area of the inner semiconductor nanowire 50.

Figure 5A:
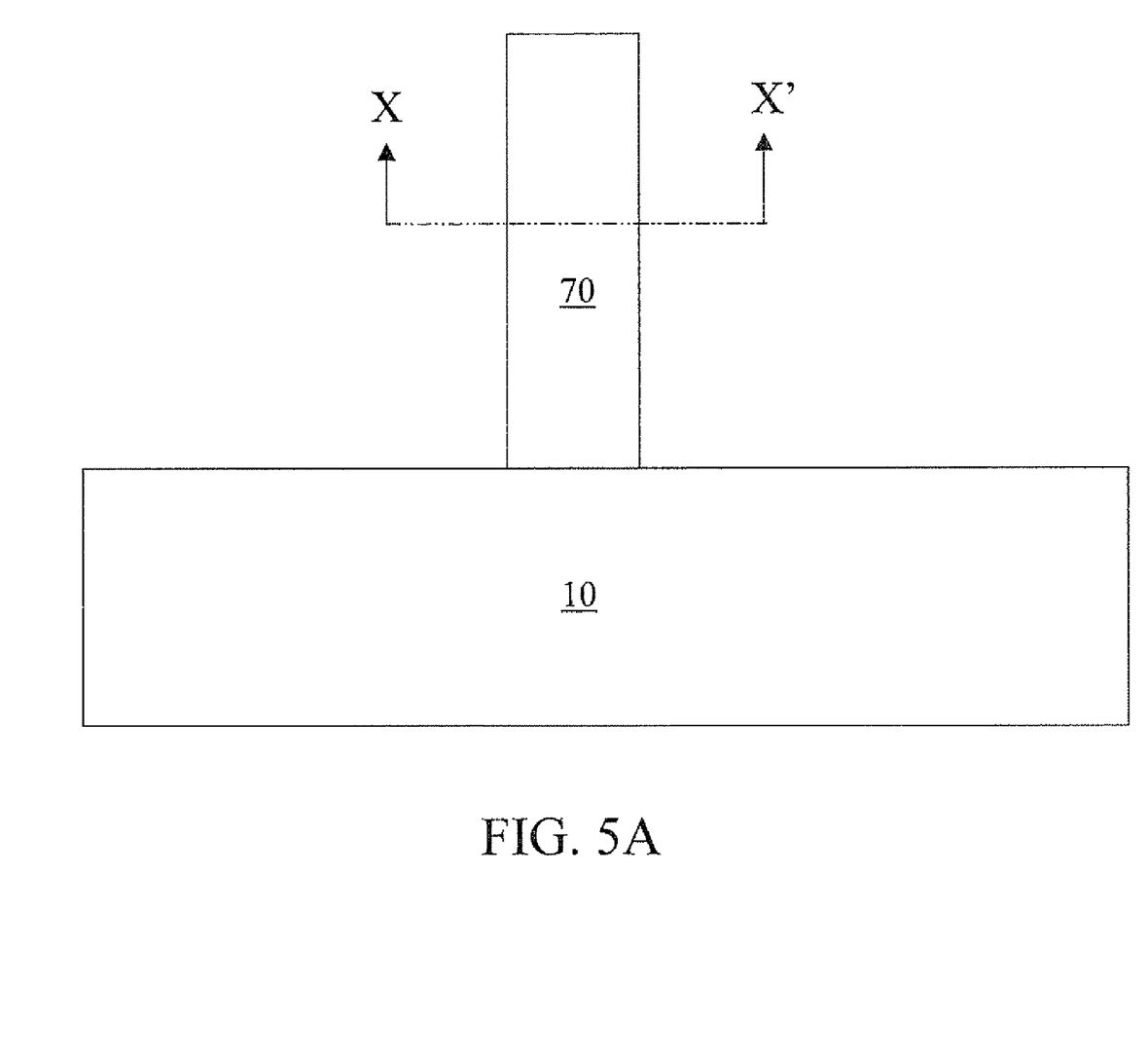
FIG. 5A is a vertical cross-sectional view of the exemplary semiconductor nanowire according to the present invention after an anneal for dopant distribution.
Figure 5B:
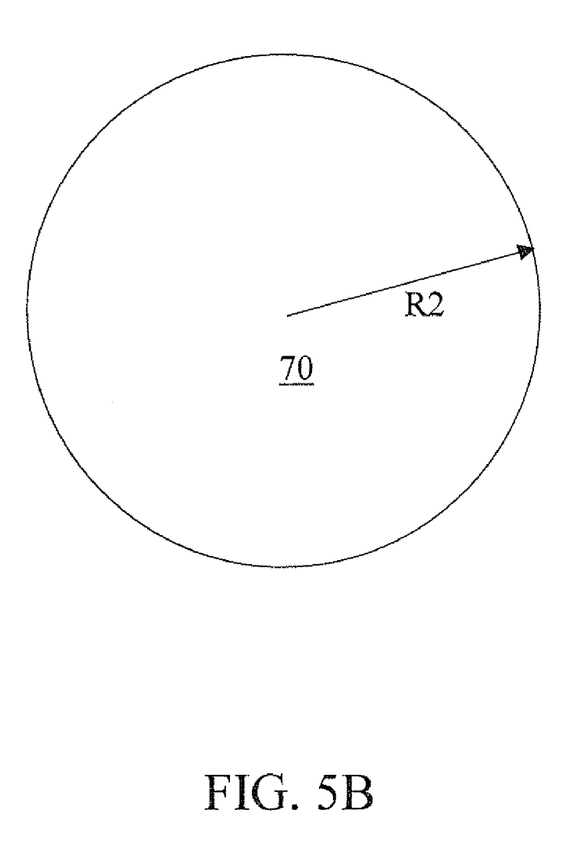
FIG. 5B is a horizontal cross-sectional view of the exemplary semiconductor nanowire in FIG. 5B along the plane X-X'.

Referring to FIGS. 5A and 5B, the catalyst particle 20 may be removed by a heating cycle, during which the catalyst 20 is separated from the assembly of the undoped semiconductor nanowire 50 and the shell 60. Methods of separating a catalyst particle from a nanowire after formation of the nanowire are known in the art.

Concurrently with the heating cycle, or subsequent to the heating cycle, the assembly of the undoped semiconductor nanowire 50 and the shell 60 is subjected to an anneal at an elevated temperature, which is typically performed at a higher temperature than the second temperature to induce diffusion of dopants in the shell 60 into the undoped semiconductor nanowire 50, thereby converting the assembly into a uniformly doped semiconductor nanowire 70. If the undoped semiconductor nanowire 50 and the shell 60 are single crystalline, the resulting structure after the anneal, which is the uniformly doped semiconductor nanowire 70, is also single crystalline.

The temperature of the anneal is selected to effect sufficient bulk diffusion of the dopants in the shell 60 into the undoped semiconductor nanowire 50 so that the dopant concentration in the uniformly doped semiconductor nanowire 70 is substantially uniform. For example, the anneal temperature may be from about 600° C. to about 1,200° C. The anneal may be performed in a furnace or in a rapid thermal anneal chamber. The duration of the anneal may be from about 1 second to about 12 hours, and typically from about 10 seconds to about 1 hour. Typically, use of a high anneal temperature requires a short duration of the anneal process, while use a low anneal temperature requires a long duration of the anneal process.

The doping concentration of the uniformly doped semiconductor nanowire 70 is the volume weighted average of the doping concentration of the undoped semiconductor nanowire 50 prior to the anneal, which is substantially zero, and the doping concentration of the shell 60 prior to the anneal. For example, if the volume of the undoped semiconductor nanowire 50 is V1, the volume of the shell 60 is V2, and the doping concentration of the shell 60 before the anneal is Cb, the doping concentration of the uniformly doped semiconductor nanowire 70 after the anneal Ca is given by: $Ca=Cb \times V2/(V1+V2)$. In case the doping concentration of the shell is from about $1.0 \times 10^{18}/cm^3$ to about $5.0 \times 10^{21}/cm^3$, the doping concentration of the uniformly doped semiconductor nanowire 70 may be from about $1.0 \times 10^{17}/cm^3$ to about $5.0 \times 10^{20}/cm^3$, although higher and lower doping concentrations for the uniformly doped semiconductor nanowire 70 may be obtained by manipulation of the dimensions of the undoped semiconductor nanowire 50 and/or the dimensions of the shell 60.

Thus, the present invention provides a method of forming a semiconductor nanowire having a high doping level, i.e., a doping concentration of about $1.0 \times 10^{17}/cm^3$ or greater, while maintaining the diameter of the semiconductor constant. Further, the lateral dimensions of the uniformly doped semiconductor nanowire 70 may be kept at a small dimension, i.e. from about 1 nm to about 30 nm, by keeping the lateral dimensions of the undoped semiconductor nanowire 50 at such a small dimension and avoiding pyrolysis of reactants at sidewalls of the undoped semiconductor nanowire 50.

Figure 6:
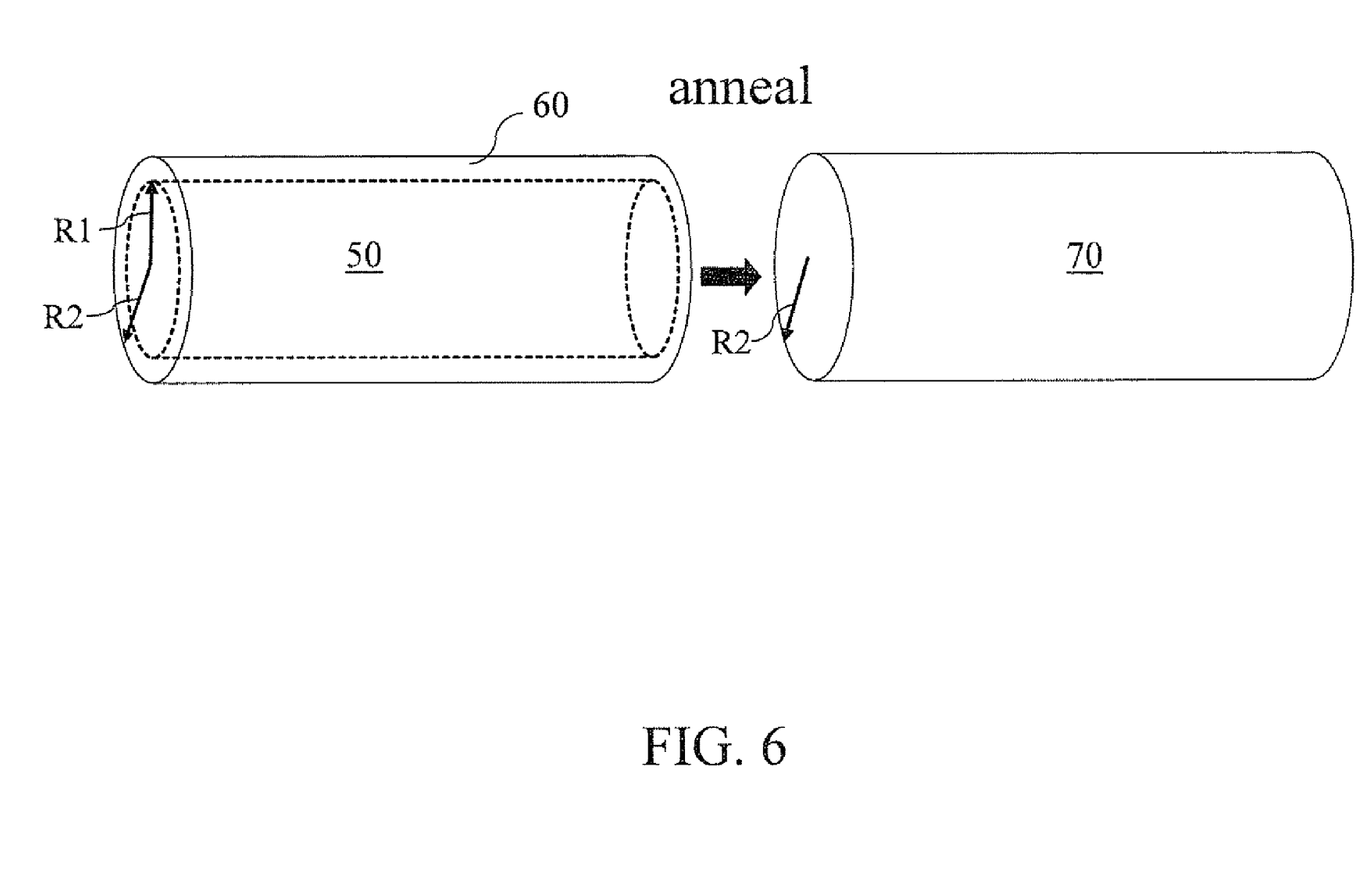
FIG. 6 is a schematic view of the transformation of the assembly of an undoped semiconductor nanowire and a shell into a doped semiconductor nanowire according to the present invention.

Referring to FIG. 6. the conversion process of the assembly of the undoped semiconductor nanowire 50 and the shell 60 into the uniformly doped semiconductor nanowire 70 by an anneal is schematically shown. The anneal homogenizes the dopant distribution within the assembly of the semiconductor nanowire 50 and the shell 60 so that the uniformly doped semiconductor nanowire 70 has a substantially "uniform" doping concentration.

Figure 7:
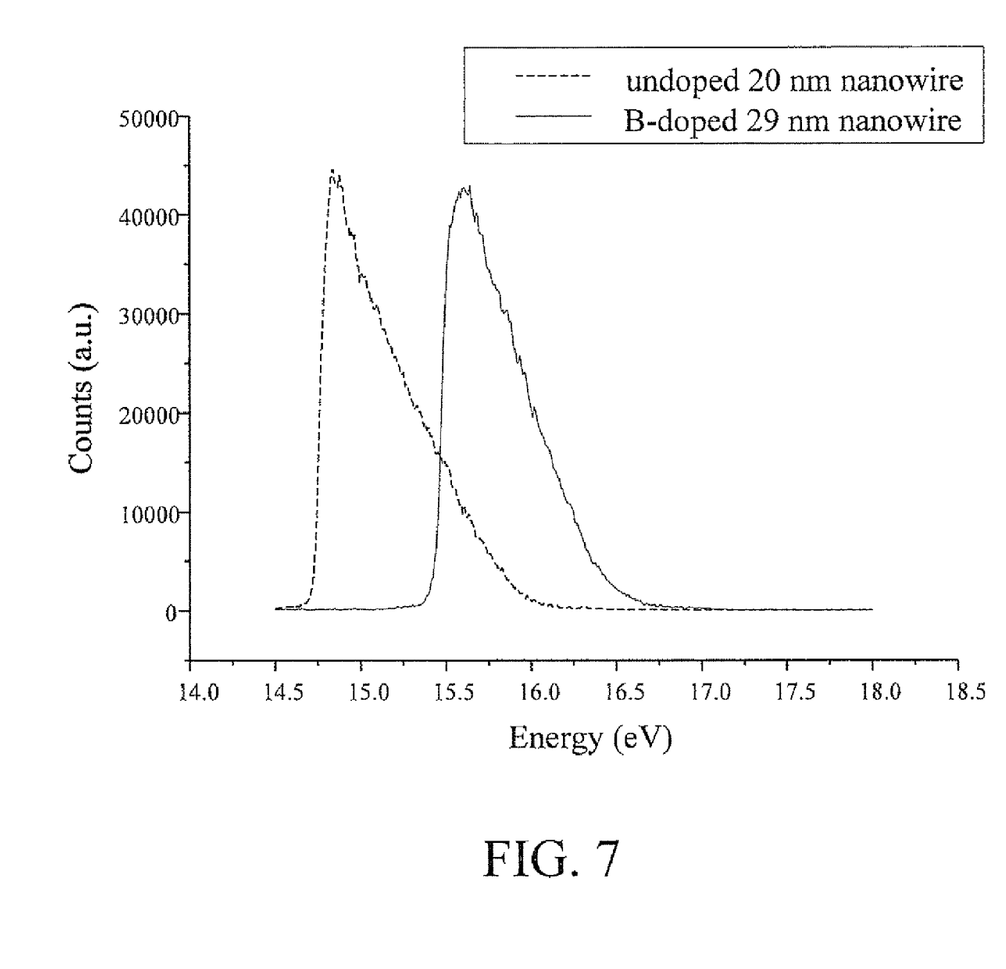
FIG. 7 shows photoelectron spectra for an undoped 20 nm diameter nanowire and a boron-doped 29 nm diameter nanowire according to the present invention.

Referring to FIG. 7, two measured photoelectron spectra are shown as a demonstration of the present invention. In this experimental set up, two nanowires were subjected to a beam of photons having 6.2 eV of kinetic energy. Photoemitted electrons were extracted with a bias potential of 15 eV so that 15 eV of energy would be added to the initial kinetic energy of the photoemitted electrons through the electrical biasing of the set up. The first nanowire comprised an undoped silicon nanowire having a diameter of 20 nm. The second nanowire comprised a uniformly doped silicon nanowire having a diameter of 29 nm and manufactured by the methods of the present invention by first forming an undoped silicon nanowire of diameter of 20 nm, followed by formation of a 4.5 nm thick doped silicon shell and a subsequent anneal. The doped silicon shell contained boron (a p-type dopant) as a doping material.

A shift in the energy of the photoemitted electrons is observed in the photoelectron spectrum of the second nanowire, which is the doped silicon nanowire, relative to the photoelectron spectrum of the first nanowire, which is the undoped silicon nanowire. The shift in the energy of the photoelectron spectrum shows that the Fermi level of the second nanowire shifted due to the doping of the second nanowire. In other words, the shift in the photoelectron spectra demonstrates that the second silicon nanowire is indeed doped with p-type dopants as disclosed in the present invention.

Figure 8A:
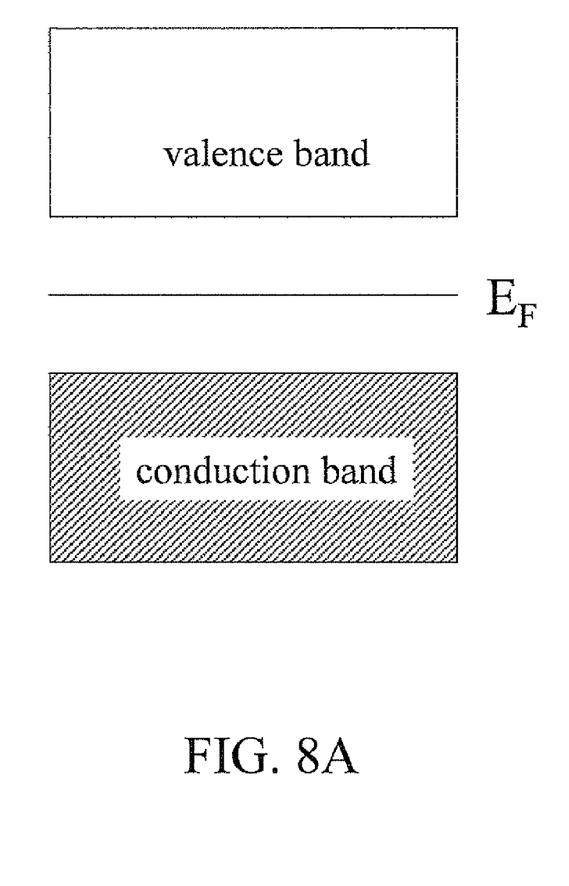
FIG. 8A-8C show band diagrams for an undoped semiconductor nanowire, a p-type semiconductor nanowire, and an n-type semiconductor nanowire according to the present invention, respectively.
Figure 8B:
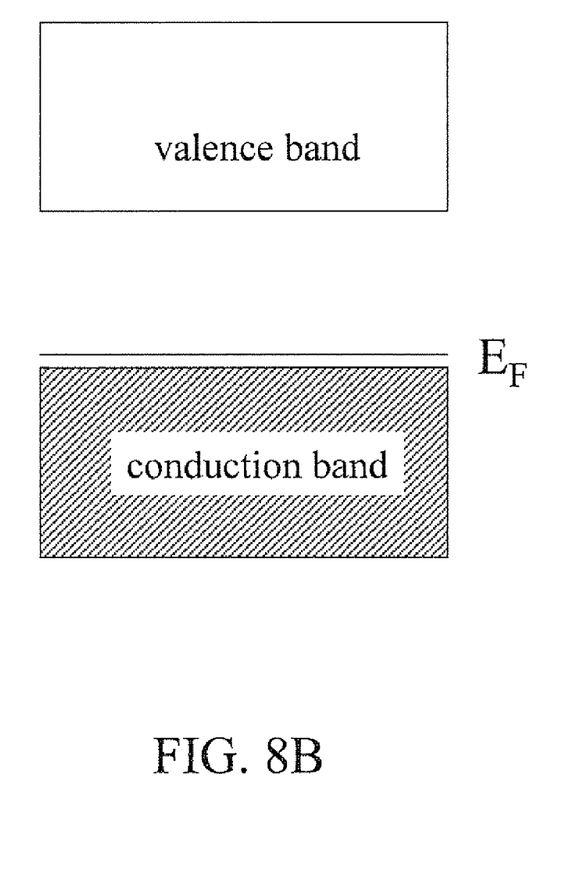
Figure 8C:
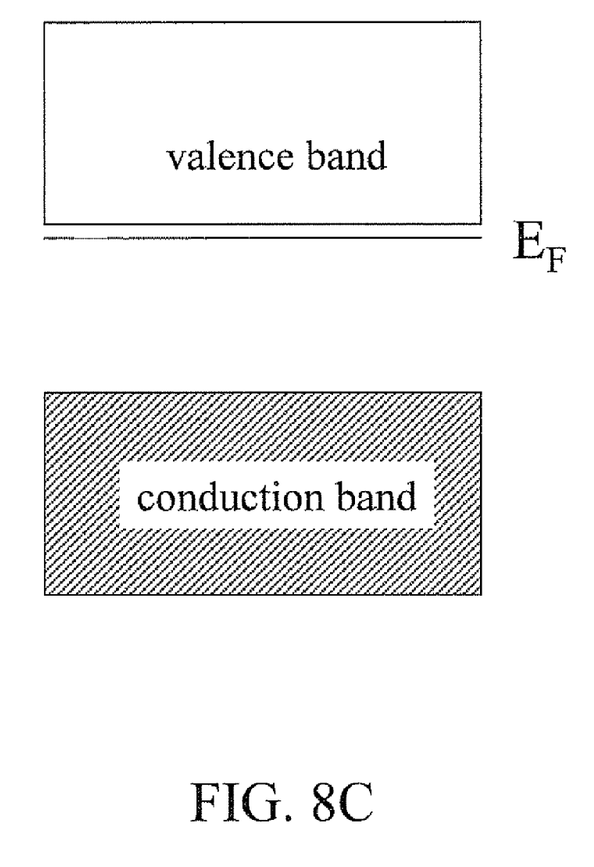

Referring to FIGS. 8A-8C, Fermi level diagrams for an undoped semiconductor nanowire, a p-doped semiconductor nanowire, and an n-doped semiconductor nanowire are shown, respectively. The present invention enables formation of p-type or n-type doped semiconductor nanowires having a shifted Fermi level relative to the Fermi level of the undoped semiconductor nanowire shown in FIG. 8A. Thus, the manipulation of the Fermi level according to the present invention enables changes in the conductivity of a semiconductor nanowire as well as determination of charge carrier types in the semiconductor nanowire.

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

What is claimed is:

1. A method of forming a semiconductor nanowire comprising:
    forming a catalyst particle on a substrate;
    growing an undoped semiconductor nanowire between said catalyst particle and said substrate by subjecting said catalyst particle to a first reactant gas at a first temperature, wherein pyrolysis of said first reactant gas on sidewalls of said semiconductor nanowire is suppressed at said first temperature; and growing a shell of a doped semiconductor material around sidewalls of said undoped semiconductor nanowire by subjecting said undoped semiconductor nanowire to a second reactant and a dopant at a second temperature, wherein said second reactant and said dopant are incorporated into said shell by pyrolysis, wherein said second temperature is higher than said first temperature and said first temperature is selected so that pyrolysis processes performed at said first temperature employing said second reactant and said dopant do not effect any significant level of dopant incorporation of said dopant, wherein said dopant includes one of $PH_3$, $POCl_3$, $AsH_3$, $SbH_3$, and $SbF_3$.

2. The method of claim 1, wherein said undoped semiconductor nanowire comprises a group IV semiconductor material, a III-V compound semiconductor material, a II-VI compound semiconductor material, and an alloy thereof.

3. The method of claim 1, wherein said doped semiconductor material comprises a group IV semiconductor material, a III-V compound semiconductor material, a II-VI compound semiconductor material, and an alloy thereof.

4. The method of claim 1, wherein said doped semiconductor material further comprises at least one of B, Ga, In, P, As, and Sb.

5. The method of claim 1, wherein said undoped semiconductor nanowire has a substantially constant cross-sectional area across an entire length of said undoped semiconductor nanowire.

6. The method of claim 5, wherein lateral dimensions of said undoped semiconductor nanowire is from about 1 nm to about 1,000 nm.

7. The method of claim 6, wherein said lateral dimensions of said undoped semiconductor nanowire are less than 30 nm.

8. The method of claim 1, wherein said shell has a substantially constant cross-sectional area across an entire length of said shell.

9. The method of claim 8, wherein said shell has a thickness from about 0.3 nm to about 10 nm.

10. The method of claim 1, wherein said shell has a doping concentration from about $1.0 \times 10^{18}/cm^3$ to about $5.0 \times 10^{21}/cm^3$.

11. The method of claim 1, wherein said catalyst particle comprises one of Au, Ag, Cu, Pt, Fe, Co, Ni, In, Ta, Ti, Zn, Cd, and Sn.

12. The method of claim 1, wherein said first reactant comprises at least one of $SiH_4$, $Si_2H_6$, $SiH_2Cl_2$, $SiHCl_3$, $SiCl_4$, $GeH_4$, $Ge_2H_6$, $GeH_3Cl$, $GeH_2Cl_2$, $GeHCl_3$, and $GeCl_4$, and wherein said first temperature is from about 350° C. to about 450° C.

13. The method of claim 1, wherein said second reactant comprises at least one of $SiH_4$, $Si_2H_6$, $SiH_2Cl_2$, $SiHCl_3$, $SiCl_4$, $GeH_4$, $Ge_2H_6$, $GeH_3Cl$, $GeH_2Cl_2$, $GeHCl_3$, and $GeCl_4$.

14. The method of claim 13, wherein said dopant comprises one of $B_2H_6$, $GaH_3$, $GaCl_3$, $Ga_2Cl_6$, $PH_3$, $POCl_3$, $AsH_3$, $SbH_3$, and $SbF_3$.

15. The method of claim 13, wherein said second temperature is from about 500° C. to about 1,100° C.

16. The method of claim 1, further comprising annealing said undoped semiconductor nanowire and said shell at an elevated temperature from about 600° C. to about 1,200° C., wherein said undoped semiconductor nanowire and said shell have a substantially uniform doping concentration after said anneal.

17. The method of claim 16, wherein said substantially uniform doping concentration is from about $1.0 \times 10^{17}/cm^3$ to about $5.0 \times 10^{20}/cm^3$, and is the product of a doping concentration of said shell and a ratio of a volume of said shell to a sum of volumes of said shell and said undoped semiconductor nanowire.

18. The method of claim 1, wherein a doping concentration of said shell is set by a partial pressure of a dopant gas in a process chamber or a ratio between a partial pressure of said dopant gas to a partial pressure of a reactant.

19. The method of claim 1, wherein said first reactant comprises at least one of $SiH_4$, $Si_2H_6$, $SiH_2Cl_2$, $SiHCl_3$, $SiCl_4$, $GeH_4$, $Ge_2H_6$, $GeH_3Cl$, $GeH_2Cl_2$, $GeHCl_3$, and $GeCl_4$, and wherein said first temperature is from 350° C. to 400° C.

20. The method of claim 19, wherein said second reactant comprises at least one of $SiH_4$, $Si_2H_6$, $SiH_2Cl_2$, $SiHCl_3$, $SiCl_4$, $GeH_4$, $Ge_2H_6$, $GeH_3Cl$, $GeH_2Cl_2$, $GeHCl_3$, and $GeCl_4$, and said second temperature is from 500° C. to 1,100° C.

* * * * *